(12) United States Patent
Kim

(10) Patent No.: US 8,295,061 B2
(45) Date of Patent: Oct. 23, 2012

(54) BOARD CONNECTING BRACKET AND ELECTRONIC INSTRUMENT HAVING THE SAME

(75) Inventor: Jong-hyun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 246 days.

(21) Appl. No.: 12/748,725

(22) Filed: Mar. 29, 2010

(65) Prior Publication Data

US 2010/0321904 A1    Dec. 23, 2010

(30) Foreign Application Priority Data

Jun. 19, 2009    (KR) ........................ 10-2009-0055108

(51) Int. Cl.
*H05K 7/02*    (2006.01)
*H05K 7/04*    (2006.01)

(52) U.S. Cl. ........................................ 361/807; 361/810

(58) Field of Classification Search .................. 361/807, 361/809–810; 174/138 E, 138 G
See application file for complete search history.

(56) References Cited

U.S. PATENT DOCUMENTS

| | | | | |
|---|---|---|---|---|
| 6,479,746 B2* | 11/2002 | Hussaini | ........................ | 174/50 |
| 7,184,277 B2* | 2/2007 | Beirne | .......................... | 361/807 |
| 7,372,707 B2* | 5/2008 | Lin | ............................... | 361/807 |
| 7,751,203 B2* | 7/2010 | Moon et al. | .................. | 361/809 |
| 7,839,658 B2* | 11/2010 | Kim | .............................. | 361/807 |
| 2007/0097023 A1* | 5/2007 | Kim | ................................ | 345/31 |

* cited by examiner

*Primary Examiner* — Hung S Bui
(74) *Attorney, Agent, or Firm* — Sughrue Mion, PLLC

(57) ABSTRACT

A board connection bracket and an electronic instrument having the same are provided. The electronic instrument includes an electronic instrument body which includes a plurality of board fixing parts on a surface; a printed circuit board which is mounted on the surface of the electronic instrument body; and a board connection bracket which connects the printed circuit board to one of the board fixing parts to fix the printed circuit board to the electronic instrument body.

24 Claims, 8 Drawing Sheets

BOARD CONNECTING BRACKET AND ELECTRONIC INSTRUMENT HAVING THE SAME

CROSS-REFERENCE TO RELATED APPLICATIONS

This application claims priority from Korean Patent Application No. 10-2009-0055108, filed Jun. 19, 2009, in the Korean Intellectual Property Office, the disclosure of which is incorporated herein by reference in its entirety.

BACKGROUND

1. Field

Apparatuses and methods consistent with the inventive concept relate to electronic devices, and more particularly, to a board connecting bracket which fixes a printed circuit board on a body of an electronic instrument and the electronic instrument having the same.

2. Description of the Related Art

Electronic instruments usually include a printed circuit board.

The size of printed circuit boards is gradually getting smaller with the technological development. Accordingly, mounting a new printed circuit board smaller than a previously used printed circuit board on an electronic instrument might cause problems.

For example, an image board mounted on a rear surface of a liquid crystal display (LCD) panel may be mounted on the body of the LCD panel by fastening screws on board fixing parts formed on corners of a rear casing of the LCD panel body. If the image board is replaced with a new model smaller than a previous model, the size of a new image board may not fit the positions of the board fixing parts formed on the rear casing of the LCD panel body.

In this situation, the design of the rear casing may need to be changed in order to mount the new image board. However, because many components besides the image board are mounted on the rear casing, it may be difficult to change the design of the rear casing. Additionally, such redesign requires considerable time and expenses.

Therefore, there is a need for a method for mounting a new printed circuit board smaller than a previous printed circuit board without changing the design of the main body of an electronic instrument.

SUMMARY

Exemplary embodiments may address at least the above problems and/or disadvantages and other disadvantages not described above. Also exemplary embodiments are not required to overcome the disadvantages described above, and an exemplary embodiment may not overcome any of the problems described above.

According to one or more exemplary embodiments, there is provided a board connection bracket which connects a new printed circuit board smaller than a previous printed circuit board to the main body of an electronic instrument while maintaining a previous design, and an electronic instrument having the same.

According to an aspect of an exemplary embodiment, there is provided an electronic instrument, including an electronic instrument body which includes a plurality of board fixing parts on a surface; a printed circuit board which is mounted on the surface of the electronic instrument body; and a board connection bracket which connects the printed circuit board to the board fixing parts so that the printed circuit board is fixed on the electronic instrument body.

The size of the printed circuit board may be made to cover a part of the plurality of board fixing parts, and the board connection bracket may connect the printed circuit board to the board fixing part which is not covered by the printed circuit board.

The board connection bracket may include a bracket body; a body supporting part which is extended from the bracket body so that the bracket body is supported on the surface of the electronic instrument body; and a slip prevention part which is extended from the bracket body to prevent the printed circuit board from slipping against the bracket body.

A first bracket opening may be formed on a side of the bracket body to be fastened with the board fixing part, and a second bracket opening may be formed on another side of the bracket body to be fastened with the printed circuit board.

At least one of the first and second bracket openings may be formed of a long opening along the lengthwise direction of the bracket body.

The body supporting part may include first and second body supporting protrusions which are extended toward the direction perpendicular to the bracket body, and the slip prevention part may include first and second slip prevention protrusions which are extended in a direction opposite to the direction in which the first and second body supporting protrusions are extended.

A slip prevention groove may be formed on the printed circuit board, and the first slip prevention protrusion may be disposed to contact on a corner of the printed circuit board, and the second slip prevention protrusion may be disposed to be inserted into the slip prevention groove.

The board connection bracket may include an upper bracket and a lower bracket, and wherein an end of the upper bracket may be connected to an end of the lower bracket and another end of the upper bracket may be spaced apart from another end of the lower bracket so that the printed circuit board is inserted.

A pressurization protrusion which presses the printed circuit board being inserted into the board connection bracket may be formed on an inner surface of the upper bracket.

The lower bracket may include a lower bracket body which is formed in a plate shape; a body supporting part which is extended from the lower bracket body so that the lower bracket body is supported on the surface of the electronic instrument body; and a slip prevention part which is extended from the lower bracket body to prevent the printed circuit board being inserted into the board connection bracket from slipping against the board connection bracket.

The body supporting part may include first and second body supporting protrusions which are extended toward the direction perpendicular to the lower bracket body, and the slip prevention part may include first and second slip prevention protrusions which are extended in a direction opposite to the direction in which the first and second body supporting protrusions are extended.

A slip prevention groove may be formed on the printed circuit board, and the first slip prevention protrusion may be disposed to contact on a corner of the printed circuit board, and the second slip prevention protrusion may be disposed to be inserted into the slip prevention groove.

The slip prevention groove may be extended to an end of the printed circuit board.

The electronic instrument body may include an external casing to mount the printed circuit board, and the board fixing parts may be formed on an external surface of the external casing.

The electronic instrument may be one of an LCD panel, a plasma display panel (PDP), and a light emitting diode (LED) panel, and the printed circuit board may be an image board.

According to another aspect of an exemplary embodiment, there is provided a board connection bracket which fixes a printed circuit board on an electronic instrument body having a plurality of board fixing parts on a surface, the board connection bracket including a bracket body which includes a side to be fastened on the board fixing part, and another side to be fastened on the printed circuit board; a body supporting part which is extended from the bracket body so that the bracket body is supported on the surface of the electronic instrument body; and a slip prevention part which is extended from the bracket body to prevent the printed circuit board from slipping against the bracket body.

The size of the printed circuit board may be made to cover a part of the plurality of board fixing parts, and the board connection bracket may connect the printed circuit board to the board fixing part which is not covered by the printed circuit board.

A first bracket opening may be formed on a side of the bracket body to be fastened with the board fixing part, and a second bracket opening may be formed on another side of the bracket body to be fastened with the printed circuit board, and at least one of the first and second bracket openings may be formed of a long opening along the lengthwise direction of the bracket body.

According to another aspect of an exemplary embodiment, there is provided a board connection bracket which fixes a printed circuit board on an electronic instrument body having a plurality of board fixing parts on a surface, the board connection bracket including an upper bracket and a lower bracket, wherein an end of the upper bracket may be connected to an end of the lower bracket and another end of the upper bracket may be spaced apart from another end of the lower bracket so that the printed circuit board is inserted.

The size of the printed circuit board may be made to cover a part of the plurality of board fixing parts, and the board connection bracket may connect the printed circuit board to the board fixing part which is not covered by the printed circuit board.

A pressurization protrusion which presses the printed circuit board being inserted into the board connection bracket may be formed on an inner surface of the upper bracket.

The lower bracket may include a lower bracket body which is formed in a plate shape; a body supporting part which is extended from the lower bracket body so that the lower bracket body is supported on the surface of the electronic instrument body; and a slip prevention part which is extended from the lower bracket body to prevent the printed circuit board being inserted into the board connection bracket from slipping against the board connection bracket.

BRIEF DESCRIPTION OF THE DRAWINGS

The above and other aspects will be more apparent by describing certain exemplary embodiments with reference to the accompanying drawings, in which.

DETAILED DESCRIPTION OF EXEMPLARY EMBODIMENTS

Figure 1:
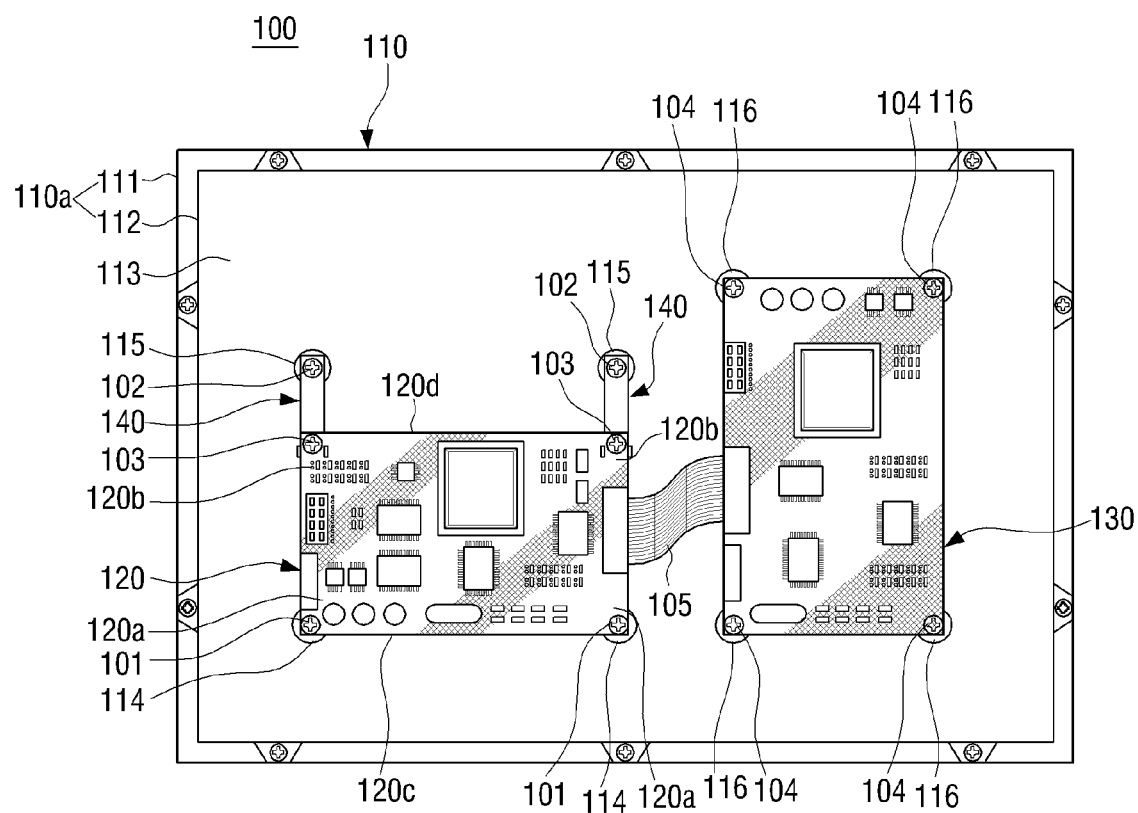
FIG. 1 is a schematic plan view of an LCD panel according to a first exemplary embodiment of the present invention taken from a rear side.

Certain exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of exemplary embodiments. However, exemplary embodiments can be practiced without those specifically defined matters. Also, well-known functions or constructions are not described in detail since they would obscure the application with unnecessary detail.

An LCD panel according to a first exemplary embodiment is described below with reference to FIGS. 1 to 4.

Figure 2:
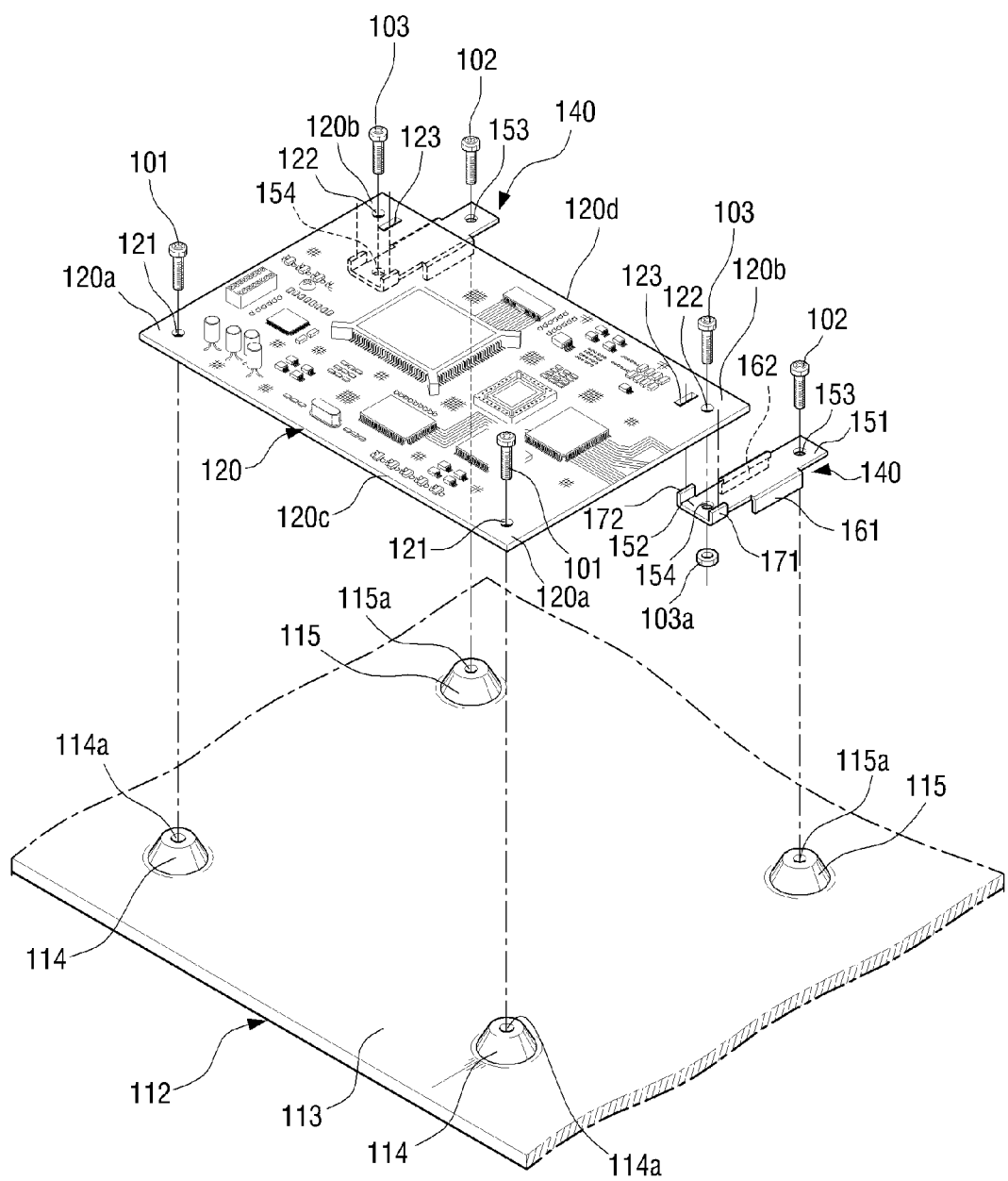
FIG. 2 is an exploded perspective view of the LCD panel illustrated in FIG. 1.
Figure 3A:
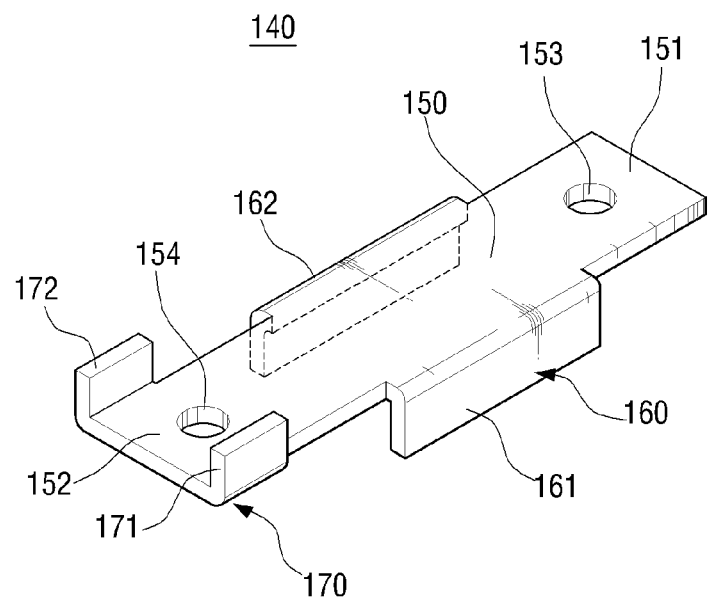
FIG. 3A is an enlarged perspective view of a board connection bracket illustrated in FIG. 2 according to an exemplary embodiment.

FIG. 1 is a schematic plan view of an LCD panel according to the first exemplary embodiment taken from a rear side, FIG. 2 is an exploded perspective view of the LCD panel illustrated in FIG. 1, and FIG. 3A is an enlarged perspective view of a board connection bracket illustrated in FIG. 2 according to an exemplary embodiment.

Referring to FIGS. 1, 2 and 3A, an LCD panel 100 according to the first exemplary embodiment includes an LCD panel body 110, an image board 120, a power board 130, and board connection brackets 140.

The LCD panel body 110 has a liquid crystal panel (not shown), a backlight unit (not shown), optical sheets (not shown), and so on therein. Light provided by the backlight unit is converted into an image having image information while passing through the liquid crystal panel, and is emitted to a front surface of the LCD panel 100. The LCD panel body 110 includes an external casing 110a to house internal components such as the liquid crystal panel, the backlight unit, the optical sheets, and so on.

The external casing 110a includes a front casing 111 and a rear casing 112. The front casing 111 houses the internal components, and the rear casing 112 is connected to the front casing 111 to cover a rear side of the front casing 111.

The rear casing 112 is formed in a rectangular plate shape and made of metal material such as aluminum. Referring to FIG. 1, image board fixing parts 114, 115 which fix the image board 120 and power board fixing parts 116 which fix the power board 130 protrude from an external surface 113 of the rear casing 112.

Female screw threads 114a, 115a are formed in the center of the image board fixing parts 114, 115. Accordingly, the image board 120 may be directly or indirectly fastened on the image board fixing parts 114, 115 by screws 101, 102. Although not illustrated, the female screw threads may be formed in the center of the power board fixing parts 116. The power board 130 may be fastened on the power board fixing parts 116 by screws 104.

The image board 120 is a printed circuit board which converts an image signal received from an external source into a proper format and transfers the converted signal to another driving board (not shown) provided in the LCD panel 100 to drive the internal components. As shown in FIGS. 1 and 2, the image board 120 is formed in a rectangular plate shape, and has a plurality of electronic components on a surface thereof. Referring to FIG. 2, board fastener openings 121, 122 are formed on corners 120a, 120b of the image board 120 to fasten the image board 120.

The board fastener openings 121 are formed on a first end 120c of the image board 120 so that the image board 120 is screwed to the image board fixing parts 114. That is, screws 101 may be fastened to the image board fixing parts 114 formed on the rear casing 112 by being inserted into the board fastener openings 121, as shown in FIGS. 1 and 2. Accordingly, the first end 120c of the image board 120 is fixed to the rear casing 112.

The board fastener openings 122 disposed on a second end 120d of the image board 120 are formed to fasten the image board 120 to the board connection brackets 140. That is, bolts 103 may fasten the image board 120 and the board connection brackets 140 by being inserted into the board fastener openings 122, as shown in FIGS. 1 and 2. The operation of fastening the image board 120 and the board connection brackets 140 is further described below.

A slip prevention groove 123 is penetratably formed on the corners 120b of the second end 120d of the image board 120 in a close proximity to the board fastener opening 122. The slip prevention groove 123 is provided to prevent the image board 120 from slipping against the board connection bracket 140, as described in greater detail below.

The power board 130 is a printed circuit board which supplies power from an external source to the components of the LCD panel 100, including the image board 120, the liquid crystal panel, and the backlight unit. Referring to FIG. 1, the corners of the power board 130 are fastened to the power board fixing parts 116 formed on an external surface 113 of the rear casing 112 by the screws 104. A flexible printed circuit board 105 may be arranged between the power board 130 and the image board 120 to electrically connect the power board 130 and the image board 120.

The board connection brackets 140 fix the image board 120 to the rear casing 112. If a size of the image board 120 is sufficiently large to cover all of the image board fixing parts 114, 115 formed on the rear casing 112, the board connection brackets 140 are not needed.

However, if the image board 120 covers only some of the image board fixing parts 114, 115, as shown in FIG. 1, the first end 120c of the image board 120 may be directly fixed to the image board fixing parts 114, but it is impossible for the second end 120d to be directly fixed to the image board fixing parts 115. Accordingly, the LCD panel 100 according to an exemplary embodiment includes the board connection brackets 140 to connect the second end 120d of the image board 120 to the image board fixing parts 115 which the image board 120 does not cover.

For example, the image board 120 may not cover all of the image board fixing parts 114, 115, as shown in FIG. 1, when the image board is replaced with a new image board smaller than the image board previously used.

Referring to FIG. 3A, the board connection bracket 140 includes a bracket body 150, a body supporting part 160, and a slip prevention part 170.

The bracket body 150 may be formed as a substantially rectangular plate. A first bracket opening 153 having a circular shape is formed on a first end portion 151 of the bracket body 150. Referring to FIG. 2, a screw 102 may be fastened to the image board fixing part 115 by being inserted into the first bracket opening 153, and thus the first end portion 151 of the bracket body 150 may be fixed to the rear casing 112.

A second bracket opening 154 having a circular shape is formed on a second end portion 152 of the bracket body 150. Referring to FIG. 2, the bolt 103 disposed on the second end 120d of the image board 120 is fastened with a nut 103a by being inserted into the board fastener opening 122 of the image board 120 and the second bracket opening 154 of the board connection bracket 140. Therefore, the second end 120d of the image board 120 is connected to the second end portion 152 of the bracket body 150.

Figure 3B:
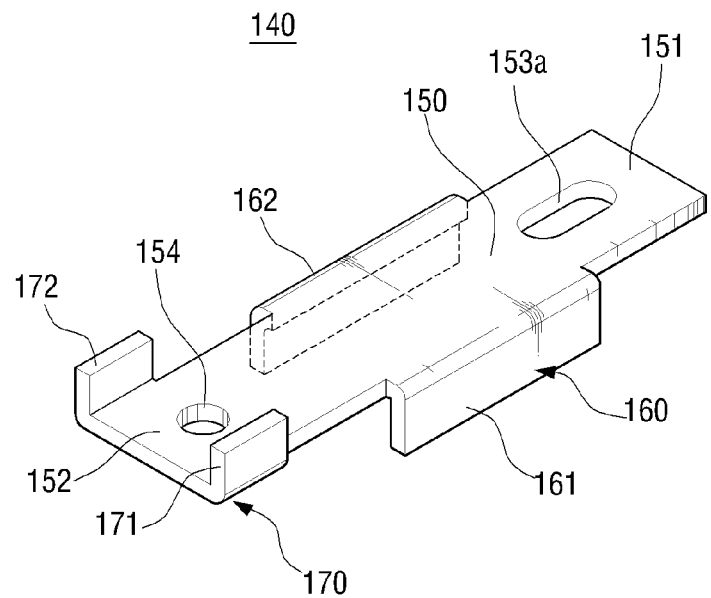
FIG. 3B is a perspective view of a board connection bracket illustrated in FIG. 2 according to another exemplary embodiment.

When the first and second bracket openings 153, 154 are formed with small circular holes, as shown in FIG. 3A, the interval between the image board fixing part 115 and the board fastener hole 122 of the image board 120 needs to be within a predetermined range for the board connection bracket 140 to be applied. However, as shown in FIG. 3B, a first bracket opening 153a may have an elongated shape, that is, the opening may have a longer dimension in the lengthwise direction of the bracket body 150 so that the board connection bracket 140 may be used with the image boards of different lengths.

Alternatively, the second bracket opening 154 may have a longer dimension in the lengthwise direction, or both of the first and second bracket openings 153, 154 may have longer dimensions in the lengthwise direction.

The body supporting part 160 includes a pair of body supporting protrusions 161, 162. The body supporting protrusions 161, 162 are substantially rectangular-shaped flanges, and are disposed on opposite sides of the bracket body 150. The body supporting protrusions 161, 162 extend from the center of the bracket body 150 substantially perpendicular to the lengthwise direction of the bracket body 150 to provide support for the vision board 120.

The pair of body supporting protrusions 161, 162 contact the rear casing 112 so that the bracket body 150 is prevented from drooping toward the rear casing 112. Accordingly, the image board 120 connected to the board connection bracket 140 is prevented from being bent and damaged by the external force.

The slip prevention part 170 includes first and second slip prevention protrusions 171, 172. The first and second slip prevention protrusions 171, 172 are flanges extending from the second end portion 152 of the bracket body 150 in a direction opposite to the direction in which the body supporting protrusions 161, 162 are extended. Accordingly, the slip prevention protrusions 171, 172 extend in a direction different from that of the body supporting part 160. Referring to FIG. 2, the first slip prevention protrusion 171 contacts the corner of the image board 120, and the second slip prevention protrusion 172 is inserted into the slip prevention groove 123 formed on the image board 120.

The first and second slip prevention protrusions 171, 172 and the slip prevention groove 123 may prevent the image board 120 from slipping against the board connection bracket 140 while the LCD panel 100 is assembled.

Figure 4:
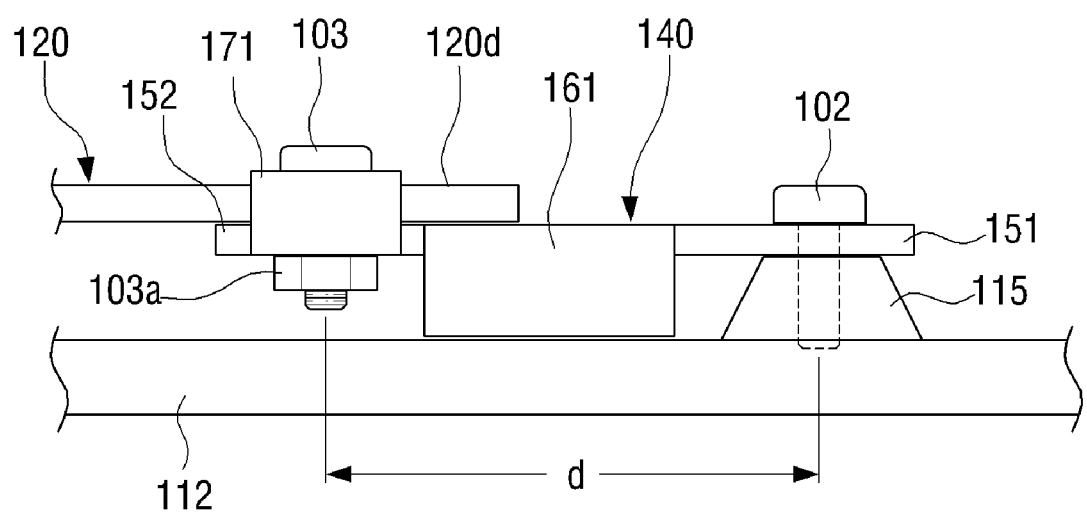
FIG. 4 is a side view provided to explain a mounting structure of the board connection bracket illustrated in FIG. 3A.

The mounting of the image board 120 and the rear casing 112 on the board connection bracket 140 is further explained with reference to FIG. 4. FIG. 4 is a side view provided to explain a mounting structure of the board connection bracket illustrated in FIG. 3.

Referring to FIG. 4, the board fastener opening 122 (referring to FIG. 2) formed on the second end 120d of the image board 120 is disposed distally from the image board fixing part 115 formed on the rear casing 112 at a predetermined distance d, e.g., the distance between the bolt 103 and the screw 102. Accordingly, the second end 120d of the image board 120 may be indirectly fixed to the corresponding image board fixing part 115.

The first end portion 151 of the board connection bracket 140 is fastened to the image board fixing part 115 by the screw 102, and the second end portion 152 of the board connection bracket 140 is fastened to the second end 120d of the image board 120 by the bolt 103 and the nut 103a. Accordingly, the second end 120d of the image board 120 is indirectly fixed on the image board fixing part 115 via the board connection bracket 140.

The LCD panel 100 according to the first exemplary embodiment connects the second end 120d of the image board 120 to the image board fixing parts 115 using the pair of board connection brackets 140, and thus it is possible to fix the image board 120 smaller than an image board previously used on the rear casing 112, while maintaining a previous design of the rear casing 112. Accordingly, since it is unnecessary to change the design of the rear casing 112 in order to mount the new image board 120 having the smaller size, the delay caused by changing the design of the image board 120 may be minimized when the LCD panel 100 is assembled.

An LCD panel according to a second exemplary embodiment is explained with reference to FIGS. 5 to 9. The description regarding the LCD panel according to the second exemplary embodiment which is common with that of the first exemplary embodiment will be omitted.

Figure 5:
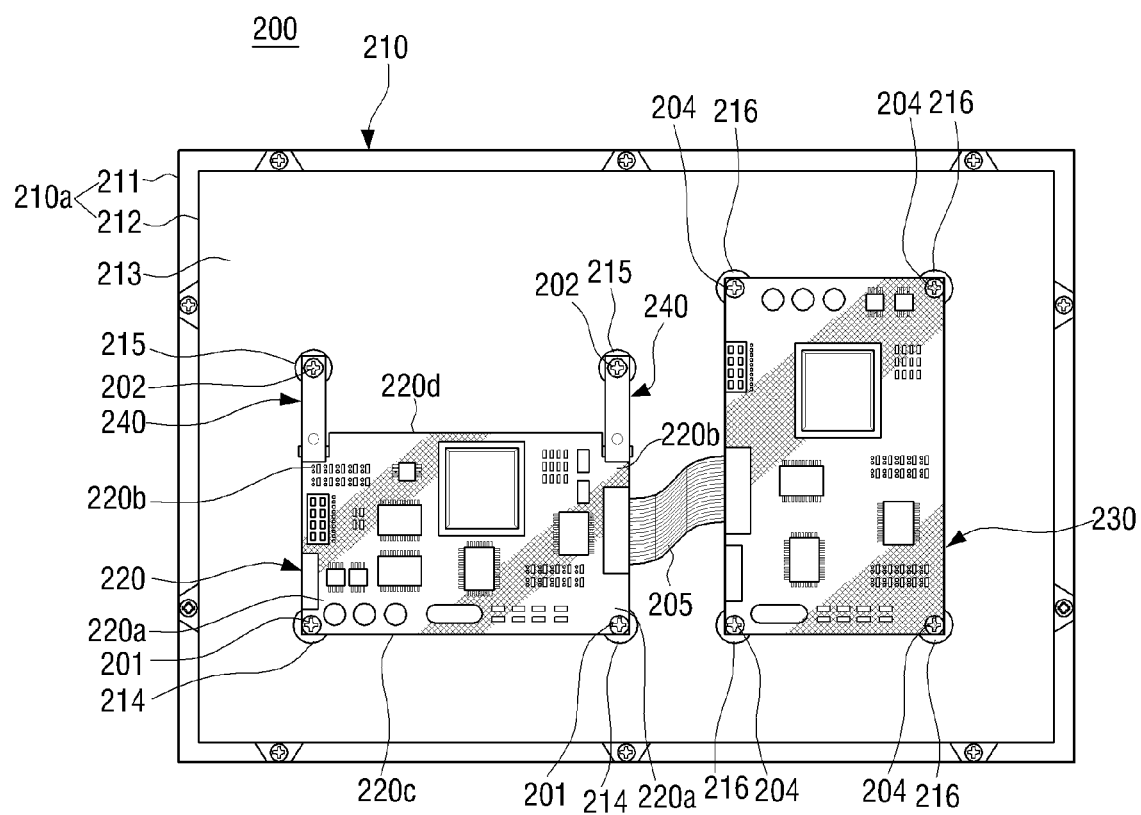
FIG. 5 is a schematic plan view of an LCD panel according to a second exemplary embodiment taken from a rear side.
Figure 6:
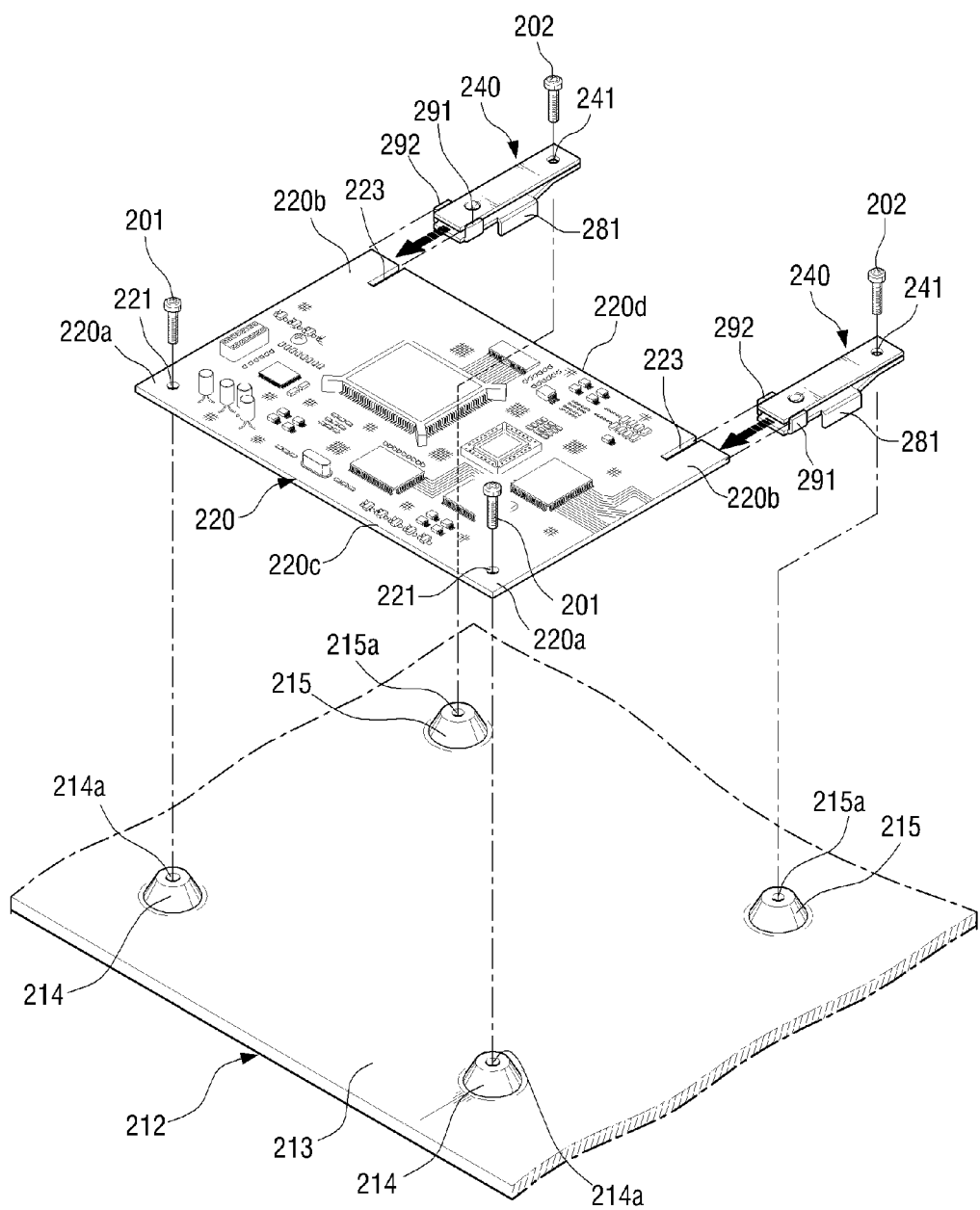
FIG. 6 is an exploded perspective view of the LCD panel illustrated in FIG. 5.
Figure 7A:
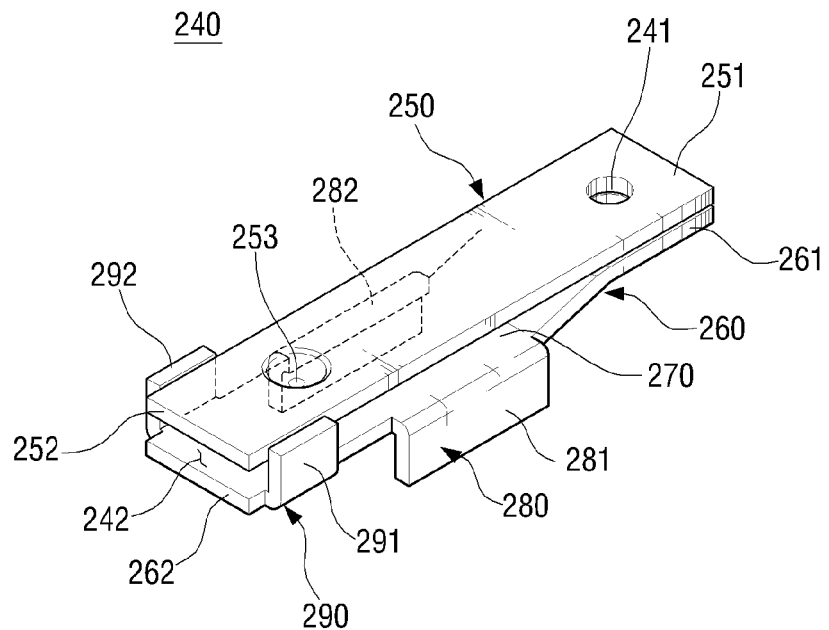
FIG. 7A is an enlarged perspective view of a board connection bracket illustrated in FIG. 6.

FIG. 5 is a schematic plan view of an LCD panel according to the second exemplary embodiment taken from a rear side, FIG. 6 is an exploded perspective view of the LCD panel illustrated in FIG. 5, and FIG. 7A is an enlarged perspective view of a board connection bracket illustrated in FIG. 6.

Referring to FIGS. 5 to 7A, an LCD panel 200 according to the second exemplary embodiment includes an LCD panel body 210, an image board 220, a power board 230, and a pair of board connection brackets 240.

The LCD panel body 210 includes an external casing 210a including a front casing 211 and a rear casing 212. Referring to FIGS. 5 and 6, image board fixing parts 214, 215 and power board fixing parts 216 are formed on the rear casing 212. The image board 220 may be directly or indirectly fastened to the image board fixing parts 214, 215 by screws 201, 202, and the power board 230 may be fastened on the power board fixing parts 216 by screws 204.

A board fastener opening 221 is formed at corners 220a disposed on a first end 220c of the image board 220. The screw 201 is fastened to the image board fixing part 214 of the rear casing 213 by being inserted into the board fastener opening 221, and thus the first end 220c of the image board 220 may be fixed to the rear casing 213.

Slip prevention grooves 223 having a rectangular shape are formed on corners 220b disposed on a second end 220d of the image board 220. The slip prevention grooves 223 are open toward the second end 220d of the image board 220, unlike the slip prevention groove 123 according to an exemplary embodiment of FIG. 2.

The power board 230 is fastened on the power board fixing parts 216 by the screws 204. A flexible printed circuit board 205 connects the power board 230 and the image board 220.

Similar to the image board 120 according to the first exemplary embodiment, the image board 220 according to the second exemplary embodiment may not cover all of the image board fixing parts 214, 215. Accordingly, as shown in FIG. 5, the first end 220c of the image board 220 is directly connected to the corresponding image board fixing parts 214, while the second end 220d of the image board 220 is connected to the corresponding image board fixing parts 215 via the board connection brackets 240.

Referring to FIG. 7A, the board connection bracket 240 includes an upper bracket 250 and a lower bracket 260. The upper bracket 250 and the lower bracket 260 are formed as substantially rectangular plates of metal material.

A first end portion 251 of the upper bracket 250 is connected to a first end portion 261 of the lower bracket 260, and a second end portion 252 of the upper bracket 250 is disposed apart from a second end portion 262 of the lower bracket 260. For example, the first end portion 251 of the upper bracket 250 may be connected to the first end portion 261 of the lower bracket 260 by a welding process, and a gap 242 is formed between the second end portion 252 of the upper bracket 250 and the second end portion 262 of the lower bracket 260. In addition, the lower bracket 260 is bent into two portions near the first end portion 261 to form the gap 242 between the upper bracket 250 and the lower bracket 260.

A first bracket opening 241 extending through the upper and lower brackets 250, 260 is formed on the first end portions 251, 261 which are connected with each other. Referring to FIG. 6, the screw 202 is fastened to the image board fixing part 215 by being inserted into the first bracket opening 241, and thus the first end portions 251, 261 of the board connection bracket 240 are fixed to the rear casing 212.

Figure 7B:
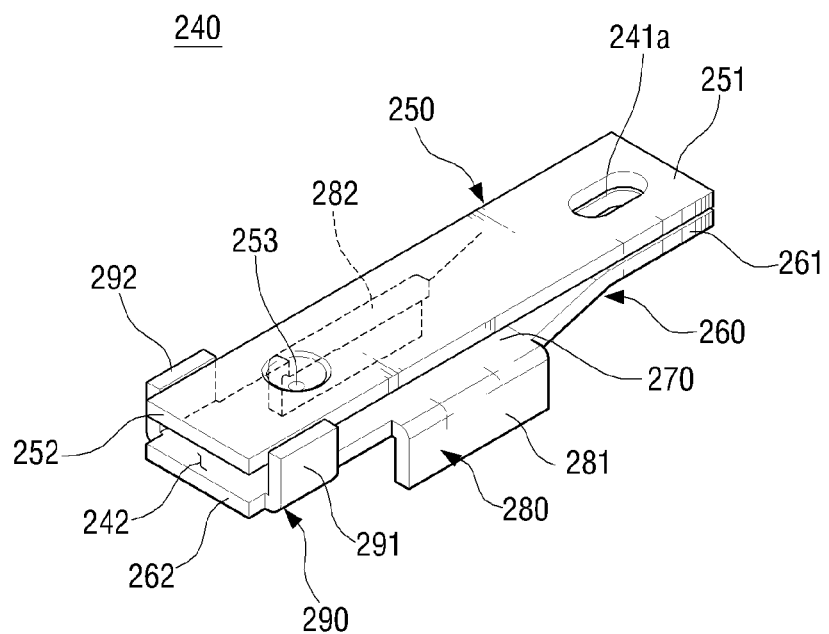
FIG. 7B is a perspective view of a board connection bracket illustrated in FIG. 5 according to another exemplary embodiment.

When the first bracket holes 240 are formed of small circular holes, as shown in FIG. 7A, the interval between the image board fixing part 215 and the second side 2520 of the image board 220 needs to be within a predetermined range for the board connection bracket 240 to be applied. However, as shown in FIG. 7B, when a first bracket opening 241a may have an elongated shape, that is, the opening may have a longer dimension in the lengthwise direction of the board connection bracket 240 so that the board connection bracket 240 may be used with image boards of different lengths.

A pressurization protrusion 253 is formed on the second end portion 252 of the upper bracket 250 extending toward the lower bracket 260. Accordingly, when the image board 220 is inserted into the gap 242 between the upper bracket 250 and the lower bracket 260, the pressure force caused by elastic deformation of the upper bracket 250 may be applied to the image board 220 by the pressurization protrusion 253.

The lower bracket 260 includes a lower bracket body 270 which is formed in a plate shape, a body supporting part 280 which extends from the center of the lower bracket body 270 in the direction perpendicular to the lengthwise direction of the lower bracket body 270, and a slip prevention part 290 which extends in a direction opposite to the direction in which the body supporting part 280 is extended.

The body supporting part 280 includes a pair of body supporting protrusions 281, 282. The body supporting protrusions 281, 282 contact the rear casing 212, and thus the board connection bracket 240 is prevented from dropping toward the rear casing 212. Accordingly, the image board 220 connected to the board connection bracket 240 is prevented from being bent and damaged by the external force.

The slip prevention part 290 includes first and second slip prevention protrusions 291, 292. Referring to FIG. 6, the first slip prevention protrusion 291 contacts the second end 220d of the image board 220. The second slip prevention protrusion 292 is inserted into the slip prevention groove 223 formed on the image board 220. As shown in FIG. 6, the slip prevention groove 223 of the image board 220 is extended to the end of the image board 220. Therefore, when the image board 220 is inserted into the board connection bracket 240, the second slip prevention protrusion 292 may be inserted into the slip prevention groove 223 to be parallel with the image board 220. Accordingly, the second end 220d of the image board 220 may be inserted into the gap 242 between the upper bracket 250 and the lower bracket 260 without being obstructed by the second slip prevention protrusion 292.

The first and second slip prevention protrusions 291, 292, and the slip prevention groove 223 may prevent the image board 220 from slipping against the board connection bracket 240 while the LCD panel 220 is assembled.

Figure 8:
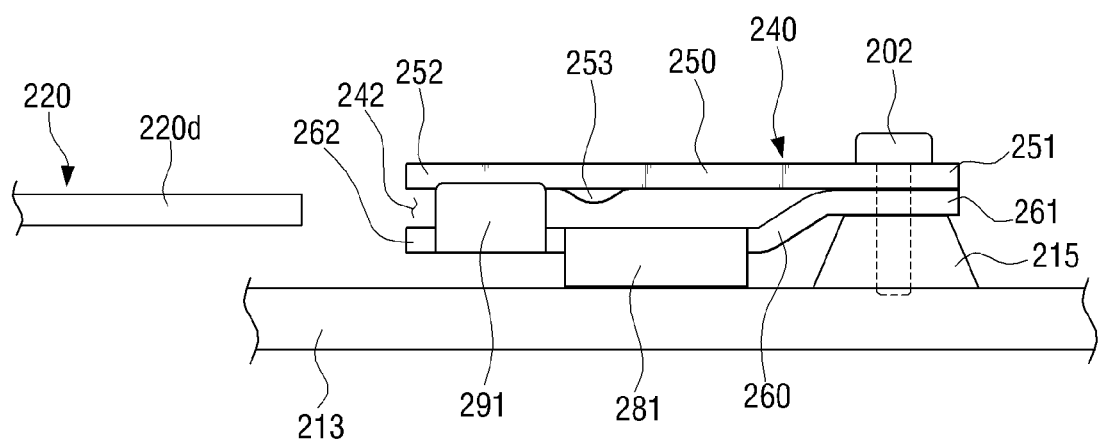
FIG. 8 is a schematic side view of a board connection bracket illustrated in FIG. 7A, before an image board is inserted.

The operation of the board connection bracket according to an exemplary embodiment is further explained with reference to FIGS. 8 and 9. FIG. 8 is a schematic side view of a board connection bracket illustrated in FIG. 7A, before an image board is inserted, and FIG. 9 is a schematic side view of a board connection bracket illustrated in FIG. 7A, after an image board is inserted.

Referring to FIG. 8, the first end portions 251, 561 of the upper and lower brackets 250, 260, which constitute the first end portion of the board connection bracket 240, are fastened to the image board fixing part 215 by the screw 202. The second end portion 252 of the upper bracket 250 is spaced apart from the second end portion 262 of the lower bracket 260 by the gap 242 into which the second end 220d may be inserted.

Figure 9:
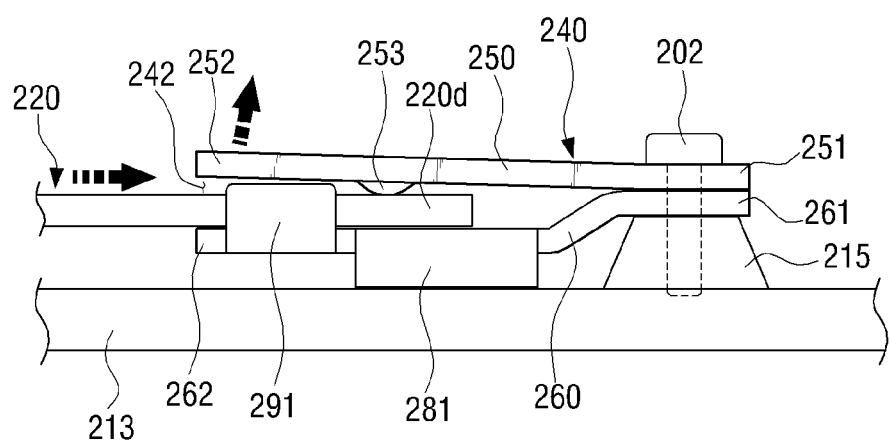
FIG. 9 is a schematic side view of a board connection bracket illustrated in FIG. 7A, after an image board is inserted.

When the image board 220 is inserted into the gap 242 between the upper bracket 250 and the lower bracket 260, the image board 220 is clamped with the board connection bracket 240, as shown in FIG. 9. That is, the image board 220 being inserted into the board connection bracket 240 elastically deforms the upper bracket 250 to be spaced apart from the upper bracket 260.

When the upper bracket 250 is elastically deformed, the upper bracket 250 has elastic force toward the lower bracket 260. The elastic force is applied to the image board 220 which is inserted through the pressurization protrusion 253 formed on the upper bracket 250. Therefore, the pressurization protrusion 250 causes the image board 220 to be clamped between the upper bracket 250 and the lower bracket 260.

In the LCD panel 200 according to the second exemplary embodiment, the second end 220d of the image board 220 is connected to the image board fixing part 215 by the board connection bracket 240, and thus the image board 220 smaller than an image board previously used may be fixed to the rear casing 212. Accordingly, it is unnecessary to change the design of the rear casing 212 to mount the new image board 220 having the smaller size, and thus the delay caused by changing the design of the image board 220 may be minimized.

In the LCD panel 200 according to the second exemplary embodiment of the present invention, the second end 220d of the image board 220 is clamped with the board connection bracket 240. Accordingly, in the LCD panel 200 according to the second exemplary embodiment, the process of assembling the components is further reduced because the second end 220d is clamped with the board connection bracket 240.

According to exemplary embodiments, the first ends 120c, 220c of the image boards 120, 220 are fastened to the rear casings 112, 212, by screws, and the first end portions of the board connection brackets 120, 240 are also fastened to the rear casings 112, 212 by screws. However, the above process of fastening the components may use bolts instead of screws. Further, although the second end 120d of the image board 120 is fastened to the board connection bracket 140 by bolts, the second end 120d of the image board 120 may be fastened to the board connection bracket 140 by screws.

Since the size of the image boards 120, 220 is smaller than that of a previously used image board, the board connection brackets 140, 240 are used in the exemplary embodiments. However, the board connection brackets 140, 240 according to the exemplary embodiments may also be used when the size of the power boards 130, 230 is smaller than that of a power board previously used.

The LCD panels 100, 200 are provided as an example of electronic instruments in exemplary embodiments, but exemplary embodiments may also be applied to other image apparatuses such as a light emitting diode (LED) panel, a plasma display panel (PDP), and other electronic instruments having a printed circuit board.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An electronic instrument comprising:
   a body which comprises a plurality of fixing parts provided on a surface of the body;
   a circuit board which is connected to the plurality of fixing parts of the body; and
   at least one bracket which connects the circuit board to at least one fixing part of the plurality of fixing parts to fix the circuit board to the body,
   wherein the at least one bracket comprises:
      a bracket body;
      a body supporting part which extends from the bracket body to support the bracket body on the surface of the body; and
      a slip prevention part which extends from the bracket body to prevent the circuit board from slipping against the bracket body, and
   wherein the body supporting part comprises first and second body supporting protrusions which extend in a first direction perpendicular to a lengthwise direction of the bracket body, and the slip prevention part comprises first and second slip prevention protrusions which extend in a second direction opposite to the first direction.

2. The electronic instrument as claimed in claim 1, wherein the at least one fixing part is not covered by the circuit board.

3. The electronic instrument as claimed in claim 1, wherein the bracket body comprises:
   a first bracket opening which is formed in a first end portion of the bracket body and through which the first end portion is fastened to a fixing part of the plurality of fixing parts; and
   a second bracket opening which is formed in a second end portion of the bracket body and through which the second end portion is fastened to the circuit board.

4. The electronic instrument as claimed in claim 3, wherein at least one of the first and second bracket openings has a longer dimension in a lengthwise direction of the bracket body.

5. The electronic instrument as claimed in claim 1, wherein the first slip prevention protrusion contacts an end portion of the circuit board, and the circuit board comprises a slip prevention groove into which the second slip prevention protrusion is inserted.

6. The electronic instrument as claimed in claim 1, wherein the body comprises an external casing to mount the circuit board, and the fixing parts are formed on an external surface of the external casing.

7. The electronic instrument as claimed in claim 1, wherein the electronic instrument is one of a liquid crystal display panel, a plasma display panel, and a light emitting diode panel, and the circuit board is an image board.

8. An electronic instrument comprising:
a body which comprises a plurality of fixing parts provided on a surface of the body;
a circuit board which is connected to the plurality of fixing parts of the body; and
at least one bracket which connects the circuit board to at least one fixing part of the plurality of fixing parts to fix the circuit board to the body,
wherein the bracket comprises:
an upper bracket; and
a lower bracket disposed on the upper bracket,
wherein a first end portion of the upper bracket contacts a first end portion of the lower bracket, a second end portion of the upper bracket is spaced apart from a second end portion of the lower bracket, and the circuit board is inserted between the second end portion of the upper bracket and the second end portion of the lower bracket.

9. The electronic instrument as claimed in claim 8, wherein the upper bracket comprises a pressurization protrusion which is formed on an inner surface of the upper bracket and presses the circuit board inserted between the second end portion of the upper bracket and the second end portion of the lower bracket.

10. The electronic instrument as claimed in claim 8, wherein the lower bracket comprises:
a lower bracket body having a plate shape;
a body supporting part which extends from the lower bracket body to support the lower bracket body on the surface of the body; and
a slip prevention part which extends from the lower bracket body to prevent the circuit board inserted into the bracket from slipping against the bracket.

11. The electronic instrument as claimed in claim 10, wherein the body supporting part comprises first and second body supporting protrusions which extend in a first direction perpendicular to a lengthwise direction of the lower bracket body, and the slip prevention part comprises first and second slip prevention protrusions which extend in a second direction opposite the first direction.

12. The electronic instrument as claimed in claim 11, wherein the first slip prevention protrusion contacts a corner of the circuit board, and the circuit board comprises a slip prevention groove into which the second slip prevention protrusion is inserted.

13. The electronic instrument as claimed in claim 12, wherein the slip prevention groove extends to an end of the circuit board.

14. A connection bracket which fixes a circuit board to a body comprising a fixing part provided on a surface of the body, the connection bracket comprising:
a bracket body which comprises a first end portion to be fastened to the fixing part, and a second end portion to be fastened to the circuit board;
a body supporting part which extends from the bracket body to support the bracket body on the surface of the electronic instrument body; and
a slip prevention part which extends from the bracket body to prevent the circuit board from slipping against the bracket body,
wherein the body supporting part comprises first and second body supporting protrusions which extend in a first direction perpendicular to a lengthwise direction of the bracket body, and the slip prevention part comprises first and second slip prevention protrusions which extend in a second direction opposite to the first direction.

15. The connection bracket as claimed in claim 14, wherein the fixing part is not covered by the circuit board.

16. The connection bracket as claimed in claim 14, wherein the bracket body comprises:
a first bracket opening which is formed in the first end portion of the bracket body and through which the first end portion is fastened to the fixing part; and
a second bracket opening which is formed in the second end portion of the bracket body and through which the second end portion is fastened to the circuit board, wherein at least one of the first and second bracket openings has a longer dimension in a lengthwise direction of the bracket body.

17. A connection bracket which fixes a circuit board to a body comprising a fixing part provided on a surface of the body, the connection bracket comprising:
an upper bracket; and
a lower bracket disposed on the upper bracket,
wherein a first end portion of the upper bracket contacts a first end portion of the lower bracket, a second end portion of the upper bracket is spaced apart from a second end portion of the lower bracket, and the circuit board is inserted between the second end portion of the upper bracket and the second end portion of the lower bracket.

18. The board connection bracket as claimed in claim 17, wherein the fixing part is not covered by the circuit board.

19. A connection bracket which fixes a circuit board to a body comprising a fixing part provided on a surface of the body, the connection bracket comprising:
an upper bracket; and
a lower bracket disposed on the upper bracket,
wherein a first end portion of the upper bracket contacts a first end portion of the lower bracket, and a second end portion of the upper bracket is spaced apart from a second end portion of the lower bracket to provide a space into which the printed circuit board is inserted,
wherein the upper bracket comprises a pressurization protrusion which is formed on an inner surface of the upper bracket and presses the circuit board being inserted between the second end portion of the upper bracket and the second end portion of the lower bracket.

20. A connection bracket which fixes a circuit board to a body comprising a fixing part provided on a surface of the body, the connection bracket comprising:
an upper bracket; and
a lower bracket disposed on the upper bracket,
wherein a first end portion of the upper bracket contacts a first end portion of the lower bracket, and a second end portion of the upper bracket is spaced apart from a second end portion of the lower bracket to provide a space into which the printed circuit board is inserted,
wherein the lower bracket comprises:
a lower bracket body having a plate shape;

a body supporting part which extends from the lower bracket body to support the lower bracket body on the surface of the body; and a slip prevention part which extends from the lower bracket body to prevent the printed circuit board inserted into the board connection bracket from slipping against the board connection bracket.

21. A connection bracket which fixes a circuit board to a body comprising a fixing part provided on a surface of the body, the connection bracket comprising:

an upper bracket; and a lower bracket disposed on the upper bracket, wherein a first end portion of the upper bracket contacts a first end portion of the lower bracket, and a second end portion of the upper bracket is spaced apart from a second end portion of the lower bracket to provide a space into which the printed circuit board is inserted, wherein the lower bracket comprises an opening formed in the first end portion of the lower bracket, the upper bracket comprises an opening formed in the first end portion of the upper bracket, and the connection bracket is fastened to the fixing part through the openings of the lower and upper brackets.

22. A bracket for connecting a circuit board to a body of an electronic instrument, the bracket comprising:

a bracket body comprising:

a first end portion which is connected to a fixing part disposed on a body of the electronic instrument;

a second end portion which is connected to the circuit board;

a center portion disposed between the first and second end portions;

a first flange part which extends from the center portion of the bracket body in a first direction toward the body the electronic instrument, to support the bracket body on the body of the electronic instrument; and a second flange part which extends from the second end portion of the bracket body in a second direction opposite the first direction, and is inserted into an opening of the circuit board to prevent the circuit board from moving with respect to the body of the electronic instrument.

23. The bracket as claimed in claim 22, wherein the bracket body further comprises:

a first opening which is formed in the first end portion and through which the first end portion is connected to the board fixing part; and a second opening which is formed in the second end portion and through which the second end portion is connected to the circuit board.

24. The bracket as claimed in claim 23, wherein the first opening has a longer dimension in a lengthwise direction of the bracket body.

* * * * *